(12) United States Patent
Bour et al.

(10) Patent No.: US 7,345,324 B2
(45) Date of Patent: *Mar. 18, 2008

(54) LIGHT EMITTING DIODES WITH GRADED COMPOSITION ACTIVE REGIONS

(75) Inventors: David P. Bour, Cupertino, CA (US); Nathan F. Gardner, Mountain View, CA (US); Werner K. Goetz, Palo Alto, CA (US); Stephen A. Stockman, Morgan Hill, CA (US); Tetsuya Takeuchi, Sunnyvale, CA (US); Ghulam Hasnain, Palo Alto, CA (US); Christopher P. Kocot, Palo Alto, CA (US); Mark R. Hueschen, Palo Alto, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 11/177,670

(22) Filed: Jul. 7, 2005

(65) Prior Publication Data
US 2005/0263780 A1 Dec. 1, 2005

Related U.S. Application Data

(62) Division of application No. 09/912,589, filed on Jul. 24, 2001, now Pat. No. 6,955,933.

(51) Int. Cl.
*H01L 33/00* (2006.01)

(52) U.S. Cl. .................. 257/101; 257/79; 257/94; 257/103; 257/E33.001

(58) Field of Classification Search ............... 257/79, 257/86, 87, 94, 103
See application file for complete search history.

(56) References Cited

U.S. PATENT DOCUMENTS

| 5,670,798 A | 9/1997 | Schetzina |
| 5,810,925 A | 9/1998 | Tadatomo et al. |
| 5,960,018 A | 9/1999 | Jewell et al. |

(Continued)

FOREIGN PATENT DOCUMENTS

WO    WO 01/41224 A2    6/2001

OTHER PUBLICATIONS

"Physics of Semiconductor Devices" 2nd Edition, by S. M. Sze, p. 9.*

(Continued)

*Primary Examiner*—Wai-Sing Louie
(74) *Attorney, Agent, or Firm*—Patent Law Group LLP

(57) ABSTRACT

A light emitting device in accordance with an embodiment of the present invention includes a first semiconductor layer of a first conductivity type having a first surface, and an active region formed overlying the first semiconductor layer. The active region includes a second semiconductor layer which is either a quantum well layer or a barrier layer. The second semiconductor layer is formed from a semiconductor alloy having a composition graded in a direction substantially perpendicular to the first surface of the first semiconductor layer. The light emitting device also includes a third semiconductor layer of a second conductivity type formed overlying the active region.

15 Claims, 5 Drawing Sheets

U.S. PATENT DOCUMENTS

| | | | |
|---|---|---|---|
| 6,045,626 | A | 4/2000 | Yano et al. |
| 6,100,106 | A * | 8/2000 | Yamaguchi et al. .......... 438/46 |
| 6,133,589 | A | 10/2000 | Krames et al. |
| 6,262,465 | B1 * | 7/2001 | Williamson et al. ........ 257/458 |
| 6,515,313 | B1 | 2/2003 | Ibbetson et al. |
| 6,630,692 | B2 | 10/2003 | Goetz et al. |
| 6,995,389 | B2 * | 2/2006 | Kim et al. .................... 257/13 |
| 7,122,839 | B2 * | 10/2006 | Shen et al. ................... 257/79 |

OTHER PUBLICATIONS

Andreas Hangleiter et al., "The Role Of Piezoelectric Fields In GaN-Based Quantum Wells," MRS Internet J. Nitride Semiconductor Research, 3, 15 (1998), 1998-1999 The Materials Research Society, pp. 1-8.

Fabio Bernardini et al., "Spontaneous Polarization And Piezoelectric Constants Of III-V Nitrides," vol. 56, No. 16, Oct. 15, 1997, The American Physical Society, 4 pages.

Tetsuya Takeuchi et al, "Determination Of Piezoelectric Fields In Strained GaInN Quantum Wells Using The Quantum-Confined Stark Effect," Applied Physics Letters, vol. 73, No. 12, Sep. 21, 1998, American Institute of Physics, pp. 1691-1693.

S.F. Chichibu et al., "Optical Properties Of InGaN Quantum Wells," Materials Science and Engineering B59 (1999) pp. 298-306.

S.F. Chichibu et al., "Effective Band Gap Inhomogeneity And Piezoelectric Field In InGaN/GaN Multiquantum Well Structures," Applied Physics Letters, vol. 73, No. 14, Oct. 5, 1998, American Institute of Physics, pp. 2006-2008.

Takashi Mukai, "Current And Temperature Dependences Of Electroluminescence Of InGaN-Based UV/Blue/Green Light-Emitting Diodes," Japanese Journal of Applied Physics, vol. 37 (1998) Pt. 2, No. 11B, pp. L1358-L1361.

Fabio Della Sala et al., "Free-Carrier Screening Of Polarization Fields In Wurtzite GaN/InGaN Laser Structures," Applied Physics Letters, vol. 74, No. 14, Apr. 5, 1999, American Institute of Physics, pp. 2002-2004.

L. H. Peng et al., "Piezoelectric Effects In The Optical Properties Of Strained InGaN Quantum Wells," Applied Physics Letters, vol. 74, No. 6, Feb. 8, 1999, American Institute of Physics, pp. 795-797.

W.W. Chow et al., "Quantum-Well Width Dependence Of Threshold Current Density In InGaN Lasers," vol.75, No. 2, Jul. 12, 1999, American Institute of Physics, pp. 244-246.

Shuji Nakamuira et al., "Introduction to Nitride Semiconductor Blue Lasers and Light Emitting Diodes," ISBN 0-7484-0836-3, 8 book pages.

Tetsuya Takeuchi et al., "Theoretical Study of Orientation Dependence of Piezoelectric Effects in Wurtzite Strained GaInN/GaN Heterostructures and Quantum Wells," Publication Board, Japanese Journal of Applied Physics, vol. 39, Part 1, No. 2A, Feb. 2000, pp. 413-416.

Tetsuya Takeuchi et al., "Quantum-Confined Stark Effect Due to Piezoelectric Fields in GaInN Strained Quantum Wells," Japanese Journal of Applied Physics, vol. 36, Part 2, No. 4A, Apr. 1, 1997, pp. L382-385.

K. Horino et al., "Initial Growth Stage of AlGaN Grown Directly on (0001) 6H—SiC By MOVPE," Mat. Res. Soc. Symp. Proc. vol. 449, 1997 Materials Research Society, pp. 73-78.

Dongjin Byun et al., Optimization of the GaN-Buffer Growth on 6H—SiC (0001), Thin Solid Films 289 (1996) pp. 256-260.

Noriyuki Kiwano et al., Cross-Sectional TEM Study Of Microstructures in MOVPE GaN films Grown On a-Al2O3 With A Buffer Layer Of AlN, Journal of Crystal Growth 115 (1991), pp. 381-387.

Shuji Nakamura, "GaN Growth Using GaN Buffer Layer," Japanese Journal of Applied Physics, vol. 30, No. 10A, Oct. 1991, pp. L1705-L1707.

H. Amano et al., "Metalorganic Vapor Phase Epitaxial Growth Of A High Quality GaN Film Using An AlN Buffer Layer," Applied Physics Letter, vol. 48, No. 5, Feb. 3, 1986, pp. 353-355.

* cited by examiner

LIGHT EMITTING DIODES WITH GRADED COMPOSITION ACTIVE REGIONS

This application is a division of application Ser. No. 09/912,589 filed Jul. 24, 2001 now U.S. Pat. No. 6,955,933 and incorporated herein by reference.

FIELD OF THE INVENTION

The present invention relates generally to semiconductor light emitting devices and more particularly to improving the light output of the active region in light emitting devices.

BACKGROUND

III-Nitride light emitting devices are based on semiconducting alloys of nitrogen with elements from group III of the periodic table. Examples of such III-Nitride devices include $In_xAl_yGa_{1-x-y}N$ light emitting diodes (LEDs) and laser diodes (LDs).

The active regions of $In_xAl_yGa_{1-x-y}N$ LEDs and LDs typically include one or more $In_xAl_yGa_{1-x-y}N$ quantum well and barrier layers. These layers typically have alloy compositions which differ from each other and differ from the surrounding layers in the device. As a consequence of these composition differences, the layers in the active region of an $In_xAl_yGa_{1-x-y}N$ light emitting device are typically biaxially strained. It should be noted that in the notation $In_xAl_yGa_{1-x-y}N$, $0 \leq x \leq 1$, $0 \leq y \leq 1$, and $x+y \leq 1$.

$In_xAl_yGa_{1-x-y}N$ crystals such as those from which $In_xAl_yGa_{1-x-y}N$ light emitting devices are formed typically adopt either the wurtzite or the zinc blende crystal structure. Both of these crystal structures are piezoelectric. That is, both develop an internal electric field when stressed. In addition, the low symmetry of the wurtzite crystal structure produces a spontaneous polarization. As a result of their biaxial strain and of the piezoelectric nature of $In_xAl_yGa_{1-x-y}N$, and as a result of the spontaneous polarization (when present), the quantum well layers and barrier layers in an $In_xAl_yGa_{1-x-y}N$ light emitting device typically experience strong internal electric fields even when the device is unbiased.

For example, FIG. 1 shows a schematic band structure diagram for a portion of an unbiased prior art $In_xAl_yGa_{1-x-y}N$ LED active region including GaN barrier layer 2, $In_xGa_{1-x}N$ quantum well layer 4, and GaN barrier layer 6. The two horizontal axes in FIG. 1 represent position in the active region in a direction perpendicular to the layers. The interfaces between the layers are indicated by dashed lines. The lower vertical axis represents the energy of the conduction band edge 8 and of the valence band edge 10 in the various layers. The upper vertical axis represents the concentration of indium in the alloys from which the various layers are formed. Layers 2, 4, and 6 are of wurtzite crystal structure with the c-axis of the crystal substantially perpendicular to the layers and directed from layer 2 toward layer 6. In the prior art active region, the mole fraction of indium is constant across the width of quantum well layer 4.

In the absence of a spontaneous polarization, piezoelectric fields, and an externally applied bias, the conduction band edge 8 and valence band edge 10 would be nominally flat within each layer. In the band structure depicted in FIG. 1, however, piezoelectric fields have tilted the band edges. This tilting adversely affects the performance of a light emitting device including the illustrated active region. As a result of this tilting, for example, the electron wave function 12 and the hole wave function 14 are concentrated on opposite sides of $In_xGa_{1-x}N$ quantum well 4. The spatial overlap of these wave functions is therefore reduced by the piezoelectric field, leading to a decrease in the probabilities of spontaneous and stimulated emission of light from the active region and an increase in the probability that electrons and holes injected into the active region will relax nonradiatively or leak out of the active region. Hence, the piezoelectric field decreases the operating efficiency of $In_xAl_yGa_{1-x-y}N$ LEDs and the optical gain in $In_xAl_yGa_{1-x-y}N$ LDs. Consequently, the piezoelectric field makes high brightness $In_xAl_yGa_{1-x-y}N$ LEDs and low threshold $In_xAl_yGa_{1-x-y}N$ LDs difficult to achieve.

Another consequence of the piezoelectric field in $In_xAl_yGa_{1-x-y}N$ light emitting devices is a reduction of the emission energy. Charge injected during operation of the device partially screens the piezoelectric field, however, and results in an increase of the emission energy as the carrier density in the quantum well layer is increased. In high-indium-content quantum well layers this shift can result in drastic color changes with variation in injection current.

What is needed is an $In_xAl_yGa_{1-x-y}N$ light emitting device in which the problems associated with the internal piezoelectric field have been overcome.

SUMMARY

A light emitting device in accordance with an embodiment of the present invention includes a first semiconductor layer of a first conductivity type having a first surface, and an active region formed overlying the first semiconductor layer. The active region includes a second semiconductor layer which is either a quantum well layer or a barrier layer. The second semiconductor layer is formed from a III-Nitride semiconductor alloy having a composition graded in a direction substantially perpendicular to the first surface of the first semiconductor layer. The light emitting device also includes a third semiconductor layer of a second conductivity type formed overlying the active region.

The second semiconductor layer may be piezoelectric and of, for example, wurtzite crystal structure. In one implementation, a mole fraction of the III-Nitride semiconductor alloy is graded in an asymmetric manner such as, for example, linearly. The composition of the III-Nitride semiconductor alloy may be graded to reduce the effect of a piezoelectric field in the active region. In one implementation, the III-Nitride semiconductor alloy is $In_xAl_yGa_{1-x-y}N$ and the mole fraction of indium is graded. In another implementation, the III-Nitride semiconductor alloy is $In_xAl_yGa_{1-x-y}N$ and the mole fraction of aluminum is graded.

In one embodiment, the active region includes a plurality of quantum well layers and at least one barrier layer. The barrier layer is formed from a III-Nitride semiconductor alloy having an indium mole fraction graded in a direction substantially perpendicular to the first surface of the first semiconductor layer. In one implementation, the III-Nitride semiconductor alloy is $In_xAl_yGa_{1-x-y}N$. The indium mole fraction in the barrier layer may be graded in an asymmetric manner such as linearly, for example, and may be graded to reduce the effect of a piezoelectric field in the active region. The barrier layer may be one of a plurality of barrier layers included in the active region and each formed from a III-Nitride semiconductor alloy having an indium mole fraction graded in a direction substantially perpendicular to the first surface of the first semiconductor layer.

Advantageously, the separation of electrons and holes induced by piezoelectric fields in the active regions of prior art light emitting devices is substantially reduced in light emitting devices in accordance with several embodiments of the present invention. Also, in some embodiments the voltage required to drive the light emitting device is reduced. Hence, light emitting devices in accordance with some embodiments of the present invention are more efficient than prior art devices. In addition, in some embodiments the emission wavelength of the light emitting device does not substantially blue shift as the carrier density in the active region is increased.

BRIEF DESCRIPTION OF THE DRAWINGS

It should be noted that the dimensions in the various figures are not necessarily to scale. Like reference numbers in the various figures denote same parts in the various embodiments.

DETAILED DESCRIPTION

In accordance with embodiments of the present invention, the active region of a semiconductor light emitting device includes a semiconductor alloy with a graded composition. Several embodiments will be described in which the active region includes one or more graded composition quantum well layers and/or one or more graded composition barrier layers.

Figure 2:
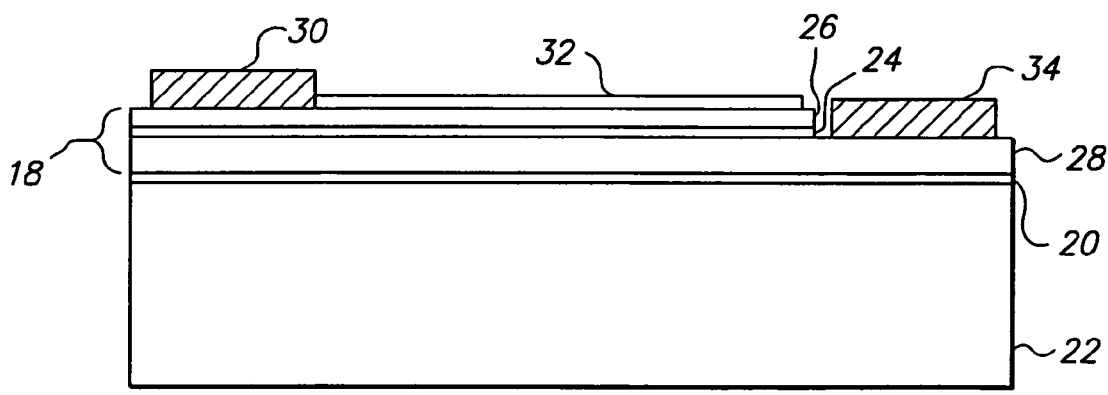
FIG. 2 is a schematic diagram of an $In_xAl_yGa_{1-x-y}N$ LED in accordance with an embodiment of the present invention.

Referring to FIG. 2, in one embodiment an $In_xAl_yGa_{1-x-y}N$ based LED 16 includes a multilayered epitaxial structure 18 disposed on a buffer layer 20, which in turn is disposed on sapphire substrate 22. Epitaxial structure 18 includes active region 24 disposed between p-type upper $In_xAl_yGa_{1-x-y}N$ region 26 and lower $In_xAl_yGa_{1-x-y}N$ region 28. $In_xAl_yGa_{1-x-y}N$ region 28 includes n-type and/or undoped $In_xAl_yGa_{1-x-y}N$ layers. Active region 24 includes one or more quantum well layers and one or more barrier layers formed from $In_xAl_yGa_{1-x-y}N$. Ohmic p-contact 30 and metallic layer 32 are electrically coupled to each other and to upper $In_xAl_yGa_{1-x-y}N$ region 26. Ohmic n-contact 34 is electrically coupled to lower $In_xAl_yGa_{1-x-y}N$ region 28. Application of a suitable forward bias across contacts 30 and 34 results in emission of light from active region 24.

Figure 3:
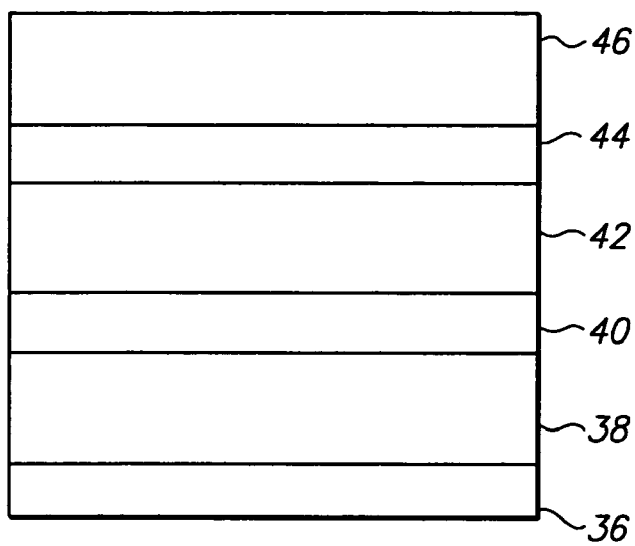
FIG. 3 is a schematic diagram of the active region of the $In_xAl_yGa_{1-x-y}N$ LED of FIG. 2 in accordance with one embodiment of the present invention.

Referring to FIG. 3, in one embodiment active region 24 includes $In_xGa_{1-x}N$ quantum well layers 36, 40, and 44, and GaN barrier layers 38, 42, and 46, with quantum well layer 36 located closest to sapphire substrate layer 22 (FIG. 2). Quantum well layers 36, 40, and 44 are about 10 Angstroms (Å) to about 100 Å (typically about 30 Å) thick. Barrier layers 38, 42, and 44 are about 25 Å to about 500 Å (typically about 100 Å) thick. Although FIG. 3 shows three quantum well layers and three barrier layers, other embodiments include either more or fewer such quantum well and barrier layers.

In one embodiment, the mole fraction of indium (subscript x in $In_xGa_{1-x}N$) in one or more of quantum well layers 36, 40, and 44 is graded to decrease with distance from the substrate. For example, the mole fraction of indium in quantum well layer 40 may decrease from a first value near the interface between quantum well layer 40 and barrier layer 38 to a second value near the interface between quantum well layer 40 and barrier layer 42. Typically, the compositions of each of quantum well layers 36, 40, and 44 are similarly graded.

The band gap of $In_xGa_{1-x}N$ decreases as the mole fraction of indium increases. In the absence of electric fields such as piezoelectric fields, for example, a graded indium concentration which decreases through a quantum well with distance from the substrate results in a graded band gap in the quantum well which increases with distance from the substrate. In such a case the conduction band edge energy in the quantum well would increase with distance from the substrate, and the valence band edge energy in the quantum well would decrease with distance from the substrate. Typically, however, epitaxial structure 18 has a (piezoelectric) wurtzite crystal structure with its c-axis oriented substantially perpendicular to and directed away from sapphire substrate 22. Hence, piezoelectric fields are typically present in quantum wells 36, 40, and 44.

Advantageously, a graded indium concentration which decreases through a $In_xGa_{1-x}N$ quantum well with distance from the substrate (that is, decreases in a direction substantially parallel to the wurtzite crystal c-axis) at least partially cancels the effect of the piezoelectric field on the conduction band edge in the quantum well. This cancellation can be understood as the result of the tilt of the conduction band edge due to the indium concentration gradient at least partially compensating for the tilt of the conduction band edge due to the piezoelectric fields. One can also understand the effect of the indium concentration gradient on the tilt of the conduction band edge as a partial cancellation of the piezoelectric field by an effective electric field, associated with the composition gradient and opposed to the piezoelectric field, experienced by an electron in the conduction band.

The effect of the piezoelectric field on the conduction band edge in a $In_xGa_{1-x}N$ quantum well can be substantially eliminated by an indium concentration gradient if the quantum well is sufficiently thin. The magnitude of the piezoelectric field in a $In_xGa_{1-x}N$ quantum well layer grown on a GaN layer (for an indium mole fraction x) is approximately $$E_{PZ} = (7 \text{ mega volts per centimeter}) \cdot x$$

(this estimate corresponds to a 7 mega volt per centimeter piezoelectric field for an InN layer grown on GaN). The effective electric field experienced by an electron in the conduction band of an $In_xGa_{1-x}N$ quantum well of thickness L centimeters and associated with an indium concentration profile that grades in the direction of the wurtzite c-axis from a mole fraction x down to a mole fraction of x=0 is $$E_{\it eff} = (1.05 \text{ volts}/L) \cdot x.$$

The latter estimate assumes a linear band gap dependence of $In_xGa_{1-x}N$ on composition and that about 70% of the 1.5 electron volt (eV) band gap difference between InN and GaN occurs in the conduction band. Equating these electric fields provides a coarse estimate of the width of a linearly graded composition $In_xGa_{1-x}N$ quantum well layer for which the effect of the piezoelectric field on the conduction band edge is approximately neutralized: L~15 Å.

Figure 1:
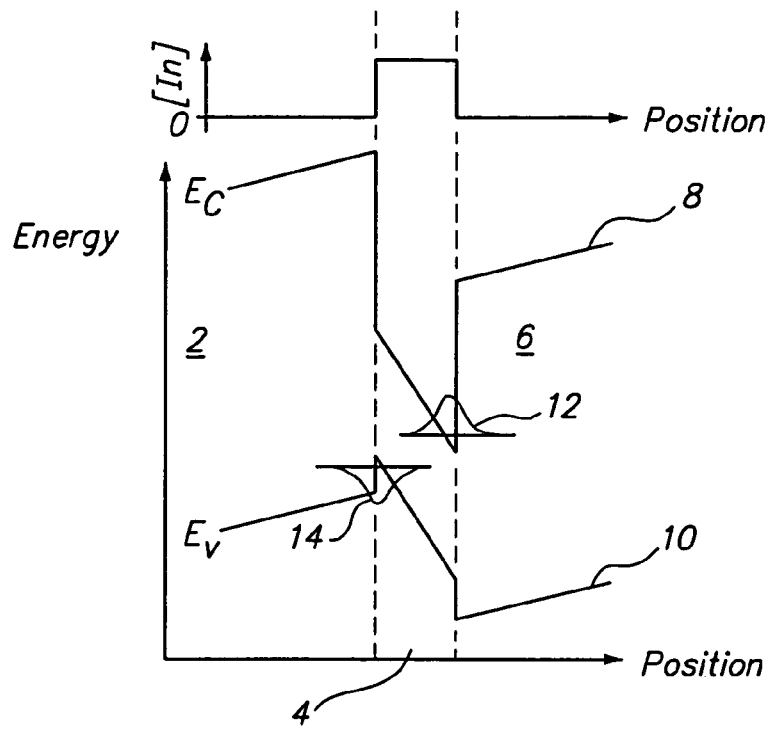
FIG. 1 is a schematic illustration of a band structure for a portion of a prior art $In_xAl_yGa_{1-x-y}N$ light emitting device.
Figure 4:
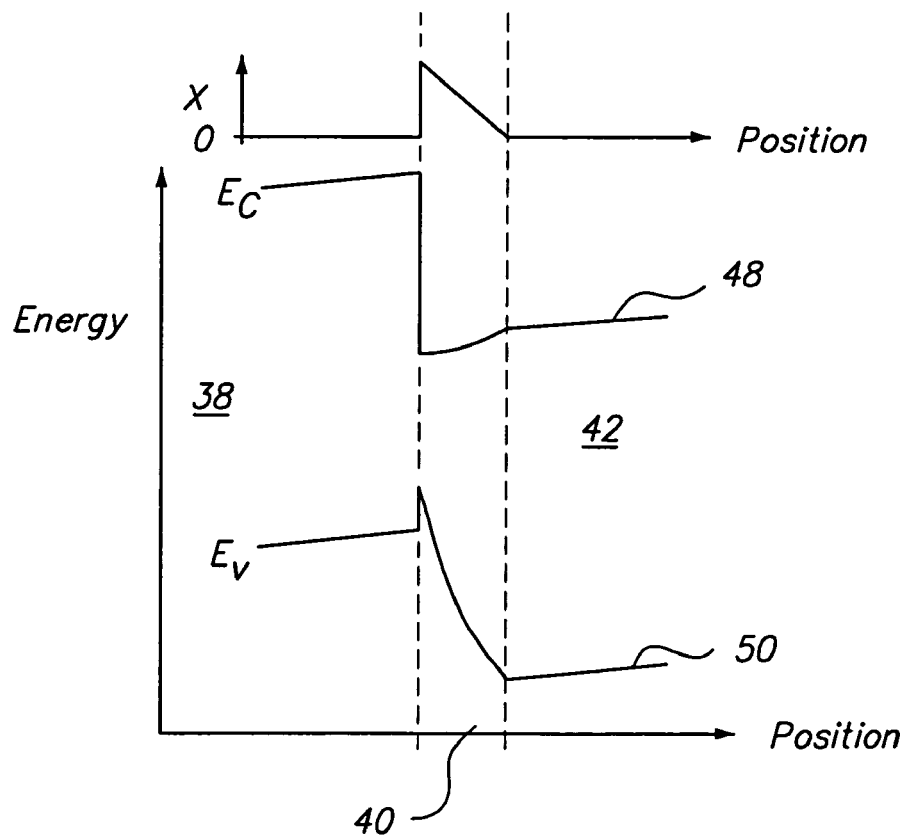
FIG. 4 is a schematic illustration of a band structure for a portion of one embodiment of the active region shown in FIG. 3.

FIG. 4 shows a schematic band structure of a portion of active region 24 including GaN barrier layers 38 and 42 and a thin $In_xGa_{1-x}N$ quantum well layer 40 in an embodiment in which the mole fraction of indium in $In_xGa_{1-x}N$ quantum well layer 40 is graded linearly from a maximum value near its interface with barrier layer 38 to about zero near its interface with barrier layer 42. The tilt of conduction band edge 48 in quantum well layer 42 has been substantially reduced compared to the tilt of conduction band edge 8 of prior art quantum well layer 4 in FIG. 1.

The tilt of valence band edge 50 in thin quantum well layer 42, however, is similar to or slightly increased with respect to that in prior art quantum well layer 4. The tilt of valence band edge 50 can be understood as the result of the tilt of the valence band edge 50 due to the indium concentration gradient adding to the tilt of the valence band edge 50 due to the piezoelectric fields. One can also understand the effect of the indium concentration gradient on valence band edge 50 as a reinforcement of the piezoelectric field by an effective electric field, associated with the composition gradient, experienced by an electron in the valence band.

Advantageously, the separation of electrons and holes that occurs in prior art $In_xGa_{1-x}N$ quantum wells is substantially reduced in graded $In_xGa_{1-x}N$ quantum wells in accordance with the present invention. In particular, in the embodiment shown in FIG. 4 both electrons and holes in quantum well layer 40 concentrate near its interface with barrier layer 38. Hence, light emitting devices in accordance with the present invention are more efficient than prior art devices. In addition, the emission wavelength of a light emitting devices in accordance with the present invention does not substantially blue shift as the carrier density in the quantum well layer is increased.

Figure 5A:
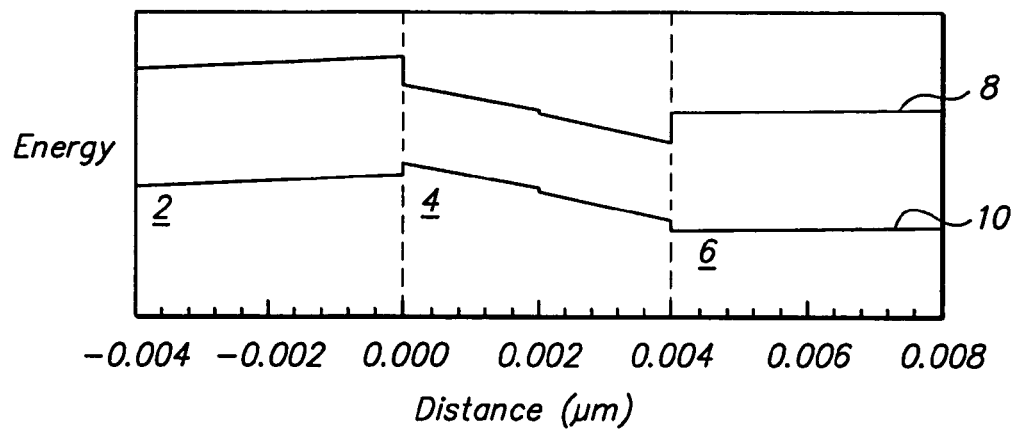
FIG. 5A is a simulated band structure for a portion of a prior art $In_xAl_yGa_{1-x-y}N$ light emitting device.
Figure 5B:
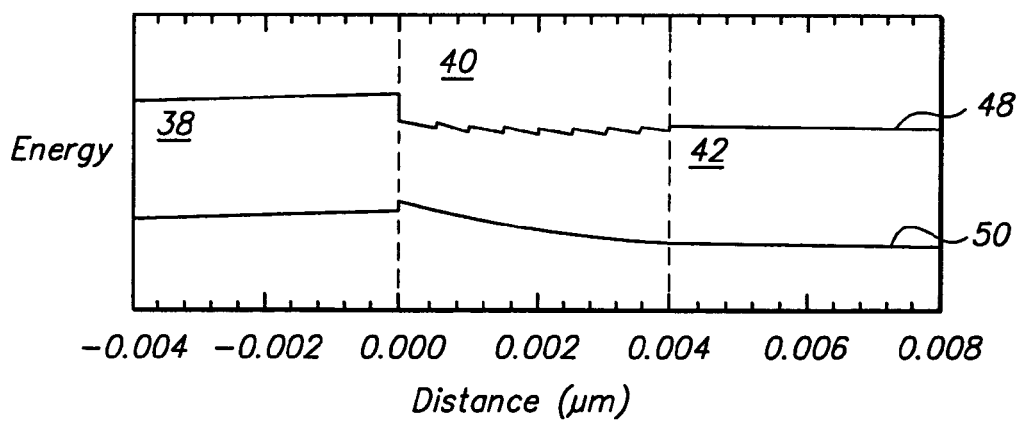
FIG. 5B is a simulated band structure for a portion of one embodiment of the active region shown in FIG. 3.

A graded indium concentration which decreases through an $In_xGa_{1-x}N$ quantum well layer with distance from the substrate may reduce the separation between electrons and holes in $In_xGa_{1-x}N$ even if the quantum well layer is thicker than about 15 Å. For example, FIG. 5A shows a conventionally simulated band structure for a prior art active region including GaN barrier layers 2 and 6 and $In_{0.4}Ga_{0.6}N$ quantum well layer 4 under a forward bias of about 2.5 volts. Barrier layers 2 and 6 are about 100 Å thick. Quantum well layer 4 is about 40 Å thick and has a spatially uniform indium concentration. The conduction band edge 8 and the valence band edge 10 in quantum well layer 4 are tilted in the same manner as in FIG. 1. In contrast, FIG. 5B shows a simulated band structure for active region 24 (under a forward bias of about 2.5 volts) in which GaN barrier layers 38 and 42 are about 100 Å thick, quantum well layer 40 is about 40 Å thick, and the mole fraction of indium in $In_xGa_{1-x}N$ quantum well layer 40 grades linearly from a mole fraction of about x=0.4 near its interface with barrier layer 38 to a mole fraction of about x=0 near its interface with barrier layer 42. Conduction band edge 48 has been flattened, compared to conduction band edge 8 in FIG. 5A. As in the embodiment shown in FIG. 4, both electrons and holes in quantum well layer 40 concentrate near its interface with barrier layer 38. Hence, this embodiment also achieves the advantages described above with respect to the embodiment shown in FIG. 4.

In another embodiment, the mole fraction of indium in one or more of quantum well layers 36, 40, and 44 is graded to increase with distance from the substrate. For example, the mole fraction of indium in quantum well layer 40 may increase from a first value near the interface between quantum well layer 40 and barrier layer 38 to a second value near the interface between quantum well layer 40 and barrier layer 42. Advantageously, a graded indium concentration which increases through an $In_xGa_{1-x}N$ quantum well in a direction substantially parallel to the wurtzite crystal c-axis at least partially cancels the effect of the piezoelectric field on the valence band edge in the quantum well. This cancellation can be understood similarly to the cancellation of the effect of the piezoelectric field on the conduction band edge described above.

Figure 6:
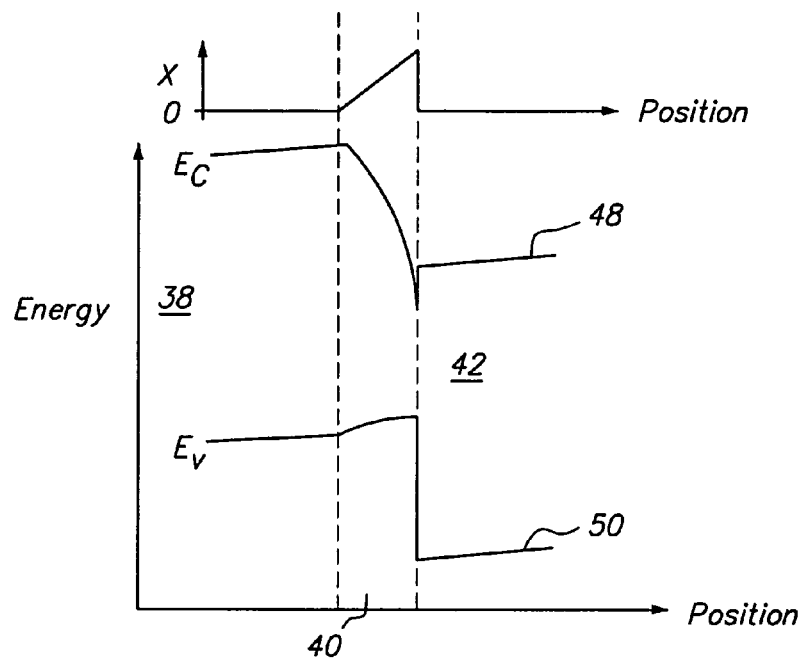
FIG. 6 is a schematic illustration of a band structure for a portion of another embodiment of the active region shown in FIG. 3.

FIG. 6 shows a schematic band structure of a portion of active region 24 including GaN barrier layers 38 and 42 and a thin $In_xGa_{1-x}N$ quantum well layer 40 in an embodiment in which the mole fraction of indium in $In_xGa_{1-x}N$ quantum well layer 40 is graded linearly from a value of about zero near its interface with barrier layer 38 to a maximum value near its interface with barrier layer 42. The tilt of valence band edge 50 in quantum well layer 42 has been substantially reduced compared to the tilt of valence band edge 10 of prior art quantum well layer 4 in FIG. 1. The tilt of the conduction band edge in this embodiment can be understood similarly to the tilt of the valence band edge in the embodiment shown in FIG. 4.

The separation of electrons and holes that occurs in prior art $In_xGa_{1-x}N$ quantum wells is substantially reduced in this embodiment as well. In particular, in this embodiment both electrons and holes in quantum well layer 40 tend to concentrate near its interface with barrier layer 42. Hence, this embodiment also achieves the advantages described above with respect to the embodiments shown in FIGS. 4 and 5B.

The above embodiments demonstrate that it can be advantageous to grade the indium concentration in an $In_xGa_{1-x}N$ quantum well to either increase or decrease in a direction substantially parallel to the wurtzite crystal c-axis. In active regions in which the offset of the conduction band edge in the quantum well and barrier layers is larger than the offset of the valence band edge, it is typically more advantageous to grade the indium concentration to decrease in the direction of the c-axis. In active regions in which the offset of the conduction band edge in the quantum well and barrier layers is smaller than the offset of the valence band edge, it is typically more advantageous to grade the indium concentration to increase in the direction of the c-axis.

Although the mole fraction of indium in quantum well layer 40 is graded linearly in the embodiments shown in FIGS. 4, 5B, and 6, other functional forms for the position dependence of the indium mole fraction in one or more of the quantum well layers in active region 24 may also be used. For example, the indium mole fraction may grade in an exponential, parabolic, or step-wise manner. Also, although the indium mole fraction decreases or increases monotonically across a quantum well in the embodiments shown in FIGS. 4, 5B, and 6, the mole fraction of indium may instead have a global maximum and/or one or more local maxima at one or more intermediate positions in the quantum well. Typically, the position dependence of the mole fraction of indium in an $In_xGa_{1-x}N$ quantum well in accordance with an embodiment of the present invention is asymmetric with respect to a plane parallel to the barrier layers and about centered in the quantum well.

The mole fraction of indium in a graded $In_xGa_{1-x}N$ quantum well in accordance with an embodiment of the present invention may range, for example, from about x=0.5 to about x=0. The mole fraction of indium in such a graded quantum well may be greater than zero at both of the quantum well's interfaces with barrier layers. That is, the mole fraction of indium need not grade all the way down to x=0.

Figure 7:
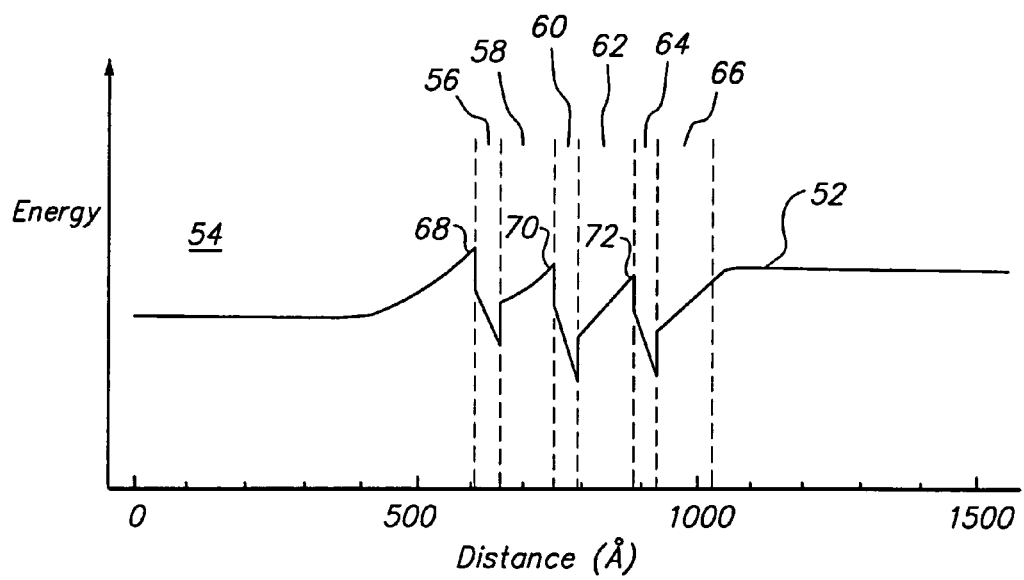
FIG. 7 is a simulated band structure for another portion of a prior art $In_xAl_yGa_{1-x-y}N$ light emitting device.

The tilt of the conduction band edge in the barrier layers of the active region of an $In_xAl_yGa_{1-x-y}N$ light emitting device also adversely affects the performance of the device. FIG. 7 shows a conventionally simulated conduction band edge 52 for a portion of a prior art $In_xAl_yGa_{1-x-y}N$ light emitting device including GaN layer 54, GaN barrier layers 58, 62, and 66, and $In_{0.4}Ga_{0.6}N$ quantum well layers 56, 60, and 64 under a forward bias of about 2.5 volts. The tilt of conduction band edge 52 in GaN layers 54, 58, 62, and 66 produces triangular potential barriers 68, 70, and 72. Electrons must be injected across these potential barriers, resulting in a disadvantageous increase of the diode voltage.

Figure 8:
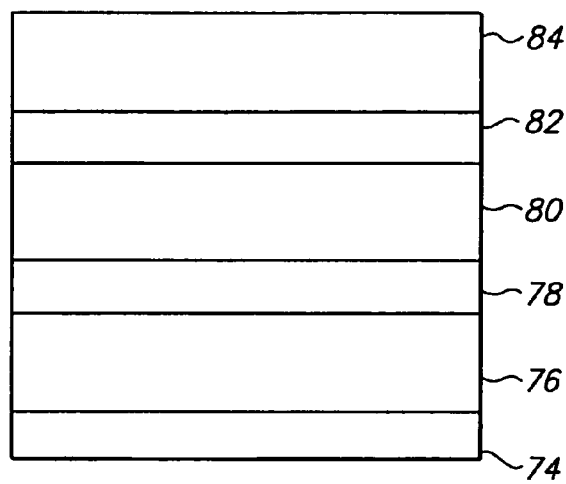
FIG. 8 is a schematic diagram of the active region of the $In_xAl_yGa_{1-x-y}N$ LED of FIG. 2 in accordance with another embodiment of the present invention.

The tilt of the conduction band edge in the barrier layers may be reduced by grading the composition of one or more of the barrier layers. Referring to FIG. 8, for example, in one embodiment active region 24 of LED 16 (FIG. 2) includes $In_{x2}Ga_{1-x2}N$ quantum well layers 74, 78, and 82, and $In_{x1}Ga_{1-x1}N$ barrier layers 76, 80, and 84, with quantum well layer 74 located closest to sapphire substrate layer 22 (FIG. 2). The mole fraction x2 of indium in quantum well layers 74, 78, and 82 is spatially uniform. The mole fraction x1 of indium in one or more of barrier layers 76, 80, and 84, however, grades with distance from substrate 22. The mole fraction of indium in a barrier layer may be graded, for example, to increase or to decrease with distance from substrate 22. The functional form for the position dependence of the indium mole fraction in a barrier layer may be, for example, linear, exponential, parabolic, or step-wise. The mole fraction of indium in a barrier layer may have a global maximum and/or one or more local maxima at one or more intermediate positions in the barrier layer. Typically, the position dependence of the mole fraction of indium in a barrier layer is asymmetric.

Figure 9:
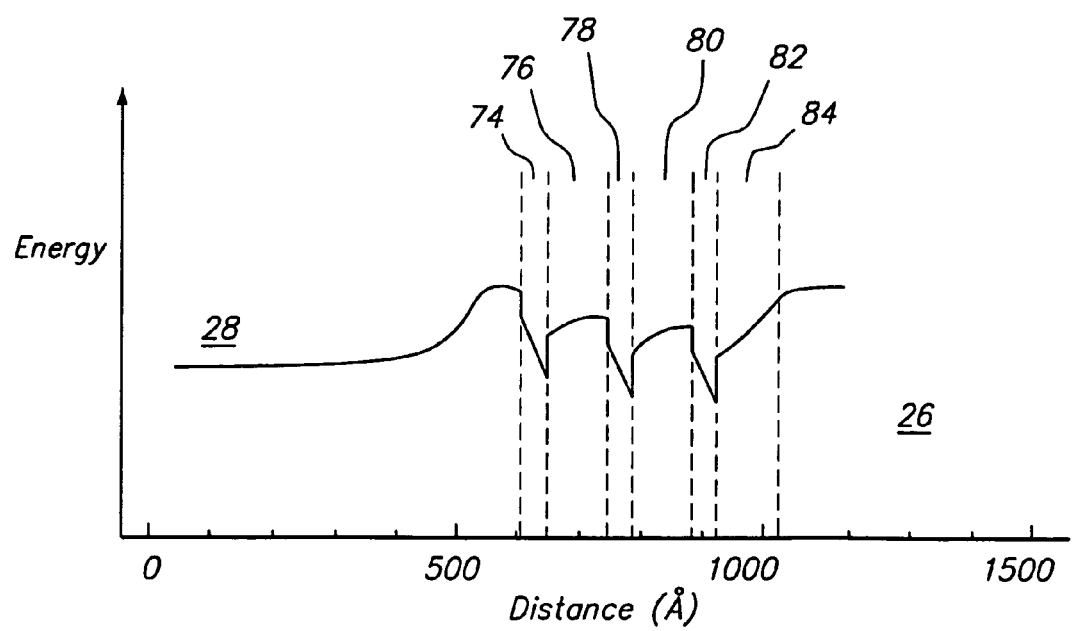
FIG. 9 is a simulated band structure for an embodiment of the $In_xAl_yGa_{1-x-y}N$ LED of FIG. 2 including the active region of FIG. 8.

One of ordinary skill in the art would expect that introduction of indium into a III-Nitride barrier layer would adversely affect device performance by decreasing carrier confinement. The inventors have discovered, however, that grading the indium mole fraction in an $In_xGa_{1-x}N$ barrier layer is beneficial. For example, FIG. 9 shows conventionally simulated conduction band edge 48 for a portion of LED 16 including active region 24, in accordance with this embodiment, under a forward bias of about 2.5 volts. In the implementation illustrated in FIG. 9, the composition of quantum well layers 74, 78, and 82 is $In_{0.4}Ga_{0.6}N$, and the mole fraction of indium in each of barrier layers 76, 80, and 84 grades from about x=0 near one side of each barrier layer to about x=0.16 near the other side of each barrier layer in the direction of the wurtzite c-axis (bottom to top in FIG. 8). Advantageously, the height of the triangular potential barriers to electron injection into quantum well layers 74, 78, and 82 are substantially reduced compared to barriers 68, 70, and 72 of FIG. 7. In other implementations, the mole fraction of indium in the quantum well layers may be greater than or less than x2=0.4 and the mole fraction of indium in the barrier layers may be greater than 0.16.

In other embodiments, active region 24 includes one or more graded composition quantum well layers and one or more graded composition barrier layers. Also, in other embodiments the mole fraction of aluminum in an $In_xAl_yGa_{1-x-y}N$ quantum well layer or barrier layer is graded in a direction substantially perpendicular to the layers. In some embodiments, both the mole fraction of aluminum and the mole fraction of indium are graded.

The various $In_xAl_yGa_{1-x-y}N$ layers in a light emitting device in accordance with an embodiment of the present invention may be formed by, for example, metal-organic chemical vapor deposition (MOCVD) or molecular beam epitaxy (MBE). Graded composition quantum well and barrier layers may be formed, for example, by varying the flow rates of reagent gases during layer deposition.

While the present invention is illustrated with particular embodiments, the invention is intended to include all variations and modifications falling within the scope of the appended claims. Referring again to FIG. 2, for example, substrate 22 may be formed from materials other than sapphire, such as SiC. Metallic layer 32 may be semitransparent to light emitted by active region 24. Alternatively, metallic layer 32 may be highly reflective to light emitted by active region 24, and LED 16 may be mounted as a flip-chip with contacts 30 and 34 facing a submount.

Graded composition active regions in accordance with the present invention may be formed in other $In_xAl_yGa_{1-x-y}N$ light emitting devices such as, for example, those described in U.S. Pat. No. 6,133,589, assigned to the assignee of the present invention and incorporated herein by reference in its entirety. Moreover, an $In_xAl_yGa_{1-x-y}N$ light emitting device in accordance with the present invention may have, in contrast to LED 16 of FIG. 2, a structure in which an n-type region overlies a p-type region, which overlies a substrate. The light emitting device may be a laser diode.

Graded composition active regions in accordance with the present invention may also be formed in other material systems such as other III-V material systems and II-VI material systems. Such graded active regions can be particularly advantageous in piezoelectric material systems and in material systems having a spontaneous polarization.

We claim:

1. A light emitting device comprising:
a first semiconductor layer of a first conductivity type having a first surface;
an active region overlying the first semiconductor layer, the active region including a second semiconductor layer, the second semiconductor layer one of a quantum well layer and a barrier layer, the second semiconductor layer formed from a III-Nitride semiconductor alloy having a composition graded in a direction substantially perpendicular to the first surface of the first semiconductor layer; and
a third semiconductor layer of a second conductivity type overlying the active region.

2. The light emitting device of claim 1, wherein the second semiconductor layer has a wurtzite crystal structure.

3. The light emitting device of claim 1, wherein the composition of the III-Nitride semiconductor alloy is graded asymmetrically.

4. The light emitting device of claim 1, wherein the composition of the III-Nitride semiconductor alloy is graded to reduce an effect of a piezoelectric field in the active region.

5. The light emitting device of claim 1, wherein a mole fraction of the III-Nitride semiconductor alloy is graded linearly.

6. The light emitting device of claim 1, wherein the III-Nitride semiconductor alloy is $In_xAl_yGa_{1-x-y}N$ with $0 \leq x \leq 1$, $0 \leq y \leq 1$, and $x+y \leq 1$.

7. The light emitting device of claim 6, wherein the mole fraction of indium is graded.

8. The light emitting device of claim 6, wherein the mole fraction of aluminum is graded.

9. A light emitting device comprising:
a first semiconductor layer of a first conductivity type having a first surface;
an active region overlying the first semiconductor layer, the active region including a plurality of quantum well layers and at least one barrier layer, the barrier layer formed from a III-Nitride semiconductor alloy having an indium mole fraction graded in a direction substantially perpendicular to the first surface of the first semiconductor layer; and
another semiconductor layer of a second conductivity type overlying the active region.

10. The light emitting device of claim 9, wherein the barrier layer has a wurtzite crystal structure.

11. The light emitting device of claim 9, wherein the indium mole fraction of the III-Nitride semiconductor alloy is graded asymetrically.

12. The light emitting device of claim 9, wherein the indium mole fraction of the III-Nitride semiconductor alloy is graded to reduce an effect of a piezoelectric field in the active region.

13. The light emitting device of claim 9, wherein the indium mole fraction of the III-Nitride semiconductor alloy is graded linearly.

14. The light emitting device of claim 9, wherein the III-Nitride semiconductor alloy is $In_xAl_yGa_{1-x-y}N$ where $0 \leq x \leq 1$, $0 \leq y \leq 1$, and $x+y \leq 1$.

15. The light emitting device of claim 9, wherein the active region includes a plurality of barrier layers each formed from a III-Nitride semiconductor alloy having an indium mole fraction graded in a direction substantially perpendicular to the first surface of the first semiconductor layer.

* * * * *